(12) United States Patent
Chen

(10) Patent No.: US 12,218,174 B2
(45) Date of Patent: Feb. 4, 2025

(54) ELECTRONIC DEVICE WITH MICRO-PHOTOELECTRIC UNITS

(71) Applicant: LG Display Co., Ltd., Seoul (KR)

(72) Inventor: Hsien-Te Chen, Taipei (TW)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/586,407

(22) Filed: Feb. 23, 2024

(65) Prior Publication Data

US 2024/0194721 A1 Jun. 13, 2024

Related U.S. Application Data

(63) Continuation of application No. 17/143,542, filed on Jan. 7, 2021, now Pat. No. 11,935,909.

(30) Foreign Application Priority Data

Jan. 16, 2020 (TW) ................................. 109101488
Jul. 2, 2020 (TW) ................................. 109122361

(51) Int. Cl.
    *H01L 27/146* (2006.01)
    *G06V 40/13* (2022.01)
    *H01L 25/04* (2023.01)

(52) U.S. Cl.
    CPC .... *H01L 27/14678* (2013.01); *G06V 40/1318* (2022.01); *H01L 25/043* (2013.01); *H01L 27/1461* (2013.01); *H01L 27/14625* (2013.01)

(58) Field of Classification Search
    CPC ............. H01L 27/14678; H01L 25/043; H01L 27/1461; H01L 27/14625; H01L 31/02164;
    (Continued)

(56) References Cited

U.S. PATENT DOCUMENTS

2012/0287085 A1* 11/2012 Yuki ................... G06F 3/04166
                                                          345/175
2016/0266695 A1*  9/2016 Bae ..................... G06V 40/1318
(Continued)

FOREIGN PATENT DOCUMENTS

| CN | 108615008 A | 10/2018 |
|----|-------------|---------|
| TW | 201913338 A | 4/2019 |
| TW | I675245 B | 10/2019 |

OTHER PUBLICATIONS

Notice of Allowance issued on Apr. 30, 2024 for Taiwan Patent Application No. 109122361.

*Primary Examiner* — Jonathan Han
(74) *Attorney, Agent, or Firm* — Morgan, Lewis & Bockius LLP

(57) ABSTRACT

An electronic device may include: a display panel comprising a pixel flexible substrate, a driving circuit, a display medium formed from an organic light-emitting material, and a plurality of shielding units; and a plurality of micro photoelectric units adjacent to a protection layer and away from the display panel. The plurality of micro-photoelectric units may comprise respective micro-photoelectric elements, and at least one of the micro-photoelectric elements may be, or may include, a sensor element. The protection layer may serve to protect the plurality of micro-photoelectric units while being located at one side of the plurality of micro-photoelectric units. Each of the plurality of micro photoelectric units may be configured to emit light toward an object, and to receive the light reflected, scattered, refracted, or diffracted by, or penetrating through, the object, or receive a signal generated from the light after being reflected, scattered, refracted, or diffracted by, or penetrating through, the object.

20 Claims, 9 Drawing Sheets

(58) Field of Classification Search
CPC .... G06V 40/1318; G06V 40/10; G06V 40/14; G06V 40/15; Y02E 60/50; G08B 21/18; G16H 50/30; H01M 8/04313
See application file for complete search history.

(56) References Cited

U.S. PATENT DOCUMENTS

| | | | |
|---|---|---|---|
| 2017/0365588 A1* | 12/2017 | Chen | H01L 33/62 |
| 2019/0026523 A1* | 1/2019 | Shen | G06V 10/243 |
| 2019/0080131 A1 | 3/2019 | Lee et al. | |
| 2019/0325190 A1 | 10/2019 | Cui et al. | |
| 2019/0392190 A1 | 12/2019 | Chen et al. | |
| 2020/0019749 A1* | 1/2020 | He | G06V 40/1324 |
| 2020/0409197 A1* | 12/2020 | Tu | G06V 40/1318 |
| 2021/0049336 A1* | 2/2021 | Tseng | G06V 40/1329 |

* cited by examiner

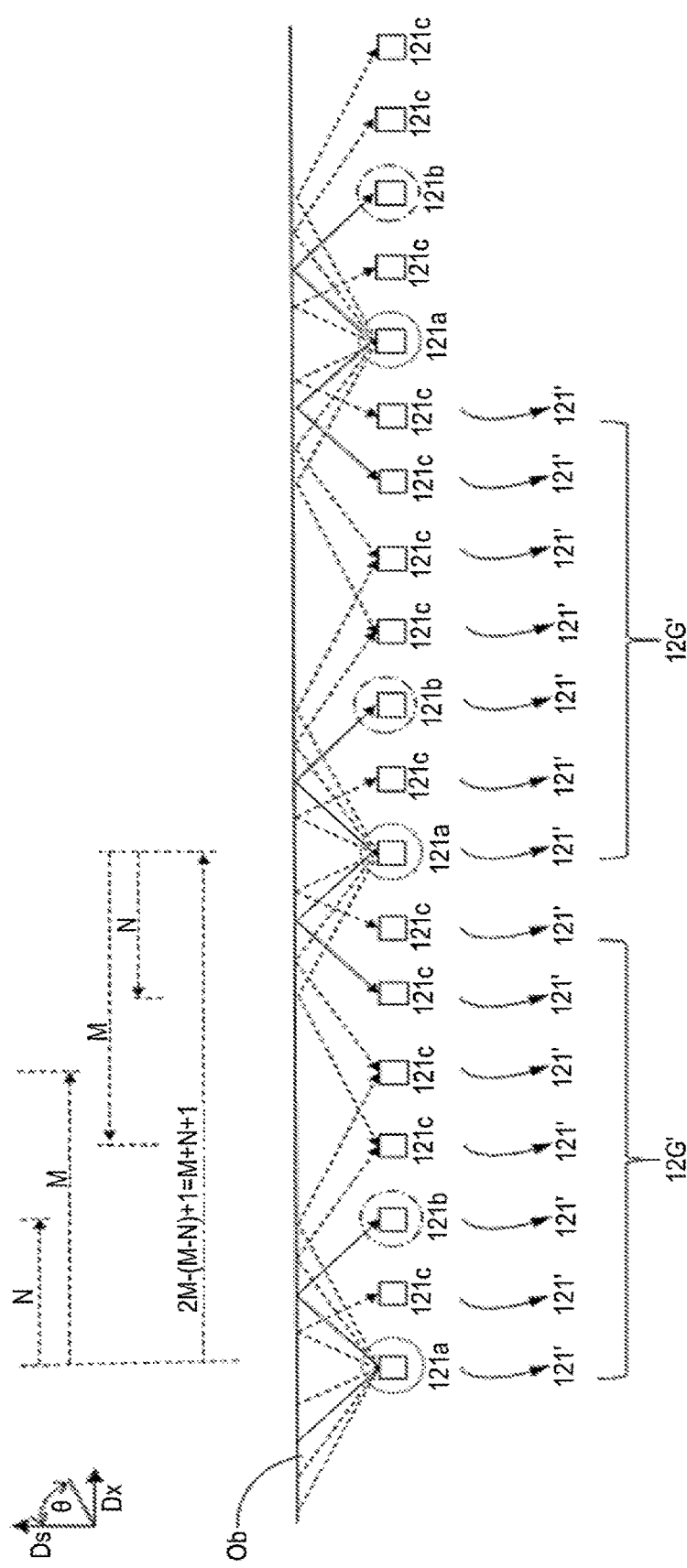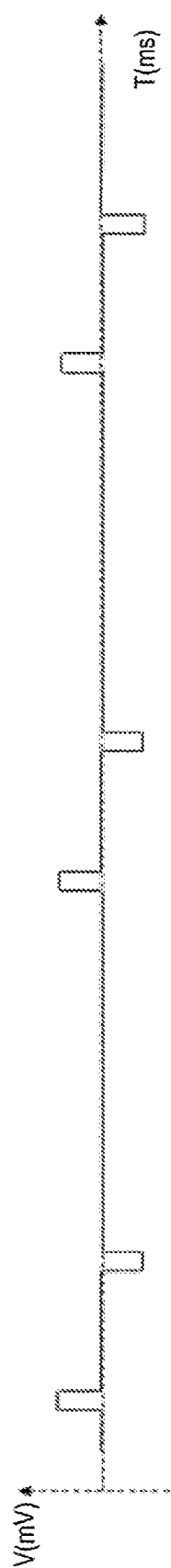
FIG.3A
FIG.4A

ELECTRONIC DEVICE WITH MICRO-PHOTOELECTRIC UNITS

CROSS REFERENCE TO RELATED APPLICATIONS

This Non-provisional application is a continuation of co-pending U.S. patent application Ser. No. 17/143,542, filed on Jan. 7, 2021, which claims priority under 35 U.S.C. § 119(a) on Patent Application No(s). 109101488 filed in Taiwan, Republic of China on Jan. 16, 2020, and 109122361 filed in Taiwan, Republic of China on Jul. 2, 2020. The entire contents of each of the above prior applications filed in the U.S. and in Taiwan, Republic of China are hereby incorporated by reference.

BACKGROUND

Technology Field

This disclosure relates to an electronic device and, in particular, to an electronic device mainly comprising micro-photoelectric elements that can be widely used in various electronic devices.

Description of Related Art

Biometric identification is to use the personal unique physiological features to identify users. Taking fingerprints as an example, since the fingerprints have the characteristics of high accuracy, they have become an important technology for information security. Besides, there are some other physiological features, such as pulse and blood oxygen saturation, can also provide many physiological parameters related to the cardiovascular system. If the physiological parameters such as pulse and blood oxygen concentration can be measured at any time, or further cooperated with (connected to) the remote server or cloud, it can provide a considerable help to the prevention of the cardiovascular system disease or life rescuing.

SUMMARY

The present disclosure provides an electronic device mainly comprising micro-photoelectric elements that can be widely used in various electronic devices.

The present disclosure provides an electronic device that can provide a high accuracy detection rate.

An electronic device comprises a first module and a second module, wherein the second module is connected to and stacked upon the first module in a stacking direction. The first module comprises a pixel substrate and a counter substrate disposed opposite to each other, and the pixel substrate is defined with a plurality of pixels. The second module is disposed at one side of the first module, which is adjacent to the counter substrate and away from the pixel substrate. The second module comprises a plurality of micro-photoelectric units and a protection layer. Each of the micro-photoelectric units of the second module unshields one or more of the pixels of the first module in the stacking direction. Each of the micro-photoelectric units comprises a micro-photoelectric element, and at least one of the micro-photoelectric elements is a sensor element. The protection layer protects the micro-photoelectric units and is disposed at one side of the second module away from the first module.

In some embodiments, the first module further comprises a plurality of shielding units, which are disposed on the pixel substrate or disposed on the counter substrate with facing toward the pixel substrate; in the first module, each of the shielding units is disposed on a plane perpendicular to the stacking direction and arranged around each of the pixels, respectively; and the micro-photoelectric units of the second module are aligned with the shielding units of the first module, respectively, in the stacking direction.

In some embodiments, the first module further comprises a plurality of filter units, which are disposed on the pixel substrate or disposed on the counter substrate with facing toward the pixel substrate; and in the first module, the filter units are aligned with the pixels, respectively, in the stacking direction.

In some embodiments, the first module further comprises a display medium disposed between the pixel substrate and the counter substrate.

In some embodiments, the electronic device further comprises a polarizer configured in the second module.

In some embodiments, the polarizer is disposed between the protection layer and the micro-photoelectric units.

In some embodiments, the polarizer is disposed between the first module and the micro-photoelectric units of the second module.

In some embodiments, the electronic device further comprises a polarizer configured in the first module located at one side of the first module away from the second module.

In some embodiments, the electronic device further comprises a backlight module disposed at one side of the first module away from the second module.

In some embodiments, the display medium is a liquid crystal material or an organic self-luminous material.

In some embodiments, the display medium is a liquid crystal material.

In some embodiments, the sensor element is used to sense by applying a reverse bias to the sensor element.

In some embodiments, the sensor element functions as a light-emitting element for emitting light by applying a forward bias to the sensor element.

In some embodiments, each of the micro-photoelectric units comprises a plurality of the micro-photoelectric elements, one of the micro-photoelectric elements is the sensor element, and another one of the micro-photoelectric elements is a light-emitting element.

In some embodiments, a plurality of the micro-photoelectric units disposed adjacent to each other form a micro-photoelectric unit group, and in the micro-photoelectric unit group, the micro-photoelectric element of one of the micro-photoelectric units senses a light emitted from the micro-photoelectric element of another one of the micro-photoelectric units.

In some embodiments, a distance between adjacent two of the micro-photoelectric units is one unit, the unit is defined as at least one positive integer times of a width of the pixel; a sensible range of the light emitted from the micro-photoelectric element for emitting the light is M units; in the same one of the micro-photoelectric unit groups, the micro-photoelectric element for emitting the light and the micro-photoelectric element for sensing the light are distanced by N units; and each of M and N is a positive integer or zero, and M is greater than N.

In some embodiments, adjacent two of the micro-photoelectric unit groups are distanced by (M+N+1) units.

In some embodiments, the micro-photoelectric units in each of the micro-photoelectric unit groups emit light sequentially.

In some embodiments, each of the micro-photoelectric elements of a part of the micro-photoelectric units comprises the sensor element, and each of the micro-photoelectric elements of another part of the micro-photoelectric units comprises a light-emitting element.

In some embodiments, each of the micro-photoelectric elements of a part of the micro-photoelectric units comprises the sensor element of one type, and each of the micro-photoelectric elements of another part of the micro-photoelectric units comprises the sensor element of another type.

In some embodiments, each of the micro-photoelectric elements of a part of the micro-photoelectric units comprises a light-emitting element of one type, and each of the micro-photoelectric elements of another part of the micro-photoelectric units comprises a light-emitting element of another type.

BRIEF DESCRIPTION OF THE DRAWINGS

The disclosure will become more fully understood from the detailed description and accompanying drawings, which are given for illustration only, and thus are not limitative of the present disclosure, and wherein:

FIGS. 3A to 3G are schematic diagram showing different operation aspects of the electronic device according to another embodiment of this disclosure; and FIGS. 4A to 4G are waveform diagrams showing the operation waveforms (voltages) corresponding to the aspects of FIGS. 3A to 3G, respectively.

DETAILED DESCRIPTION OF THE DISCLOSURE

The electronic device according to the embodiments of the disclosure will be described below with reference to related drawings, wherein the same components will be described with the same reference numbers or symbols. The illustrations of all implementation aspects of the disclosure are merely illustrative, and do not represent the actual sizes or proportions. In addition, the orientations "up" and "down" in the content of the following embodiments are merely used to indicate relative positional relationships. Furthermore, forming an element "on", "above", "below" or "under" another element may include the case of directly contacting two elements, or the case of indirectly contacting two elements, which means an additional element is disposed between two elements and the two elements do not directly contact with each other. In addition, the "electronic device" of the following embodiments can be applied to the technical fields such as a sensing device (e.g., a fingerprint or palm prints recognizer), a touch device, a display device, a micro projector, or an illumination device. Wherein, the display device can be, for example, a virtual reality (VR) head-mounted display or an augmented reality (AR) head-mounted display, and this disclosure is not limited.

Figure 1:
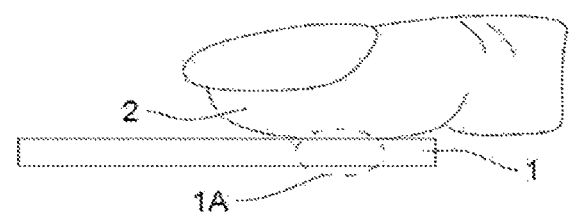
FIG. 1 is a schematic diagram showing an electronic device according to an embodiment of this disclosure.
Figure 1A:
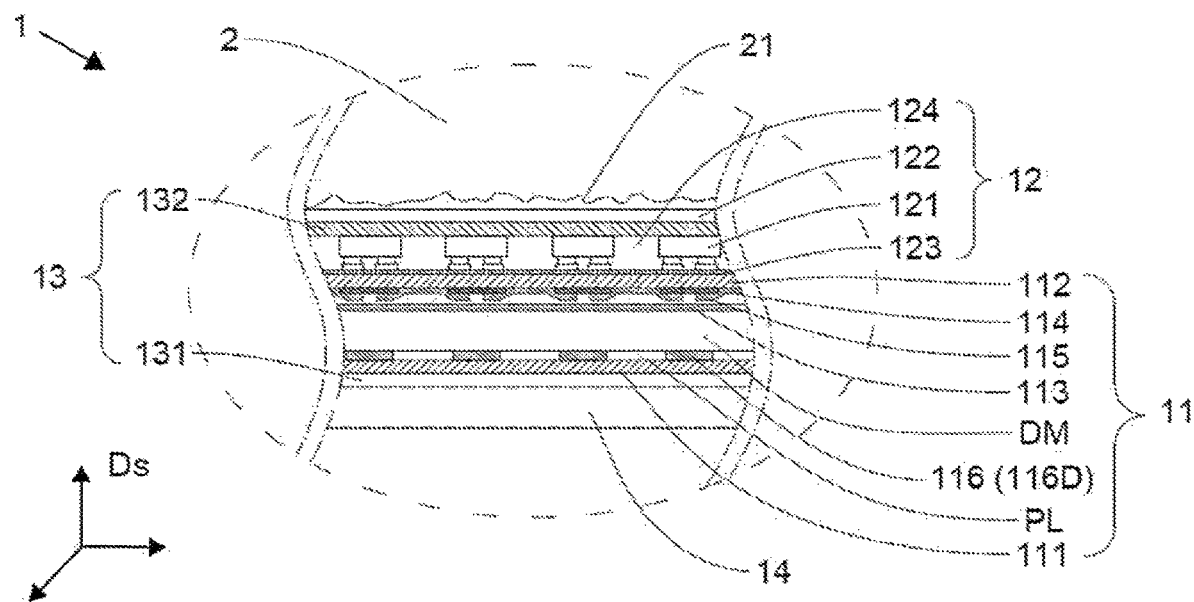
FIG. 1A is a partial enlarged view of a structure of the electronic device of FIG. 1.

FIG. 1 is a schematic diagram showing an electronic device 1 according to an embodiment of this disclosure, which is used in biometric identification or parameter measurement, and FIG. 1A is a partial enlarged view of a structure of the electronic device 1 of FIG. 1.

As shown in FIG. 1, the finger 2 touches the electronic device 1 of this disclosure. As shown in FIG. 1A, the electronic device 1 comprises a first module 11 and a second module 12, which is stacked on the first module 11. The first module 11 comprises a pixel substrate 111 and a counter substrate 112 disposed opposite to the pixel substrate 111. The pixel substrate 111 is defined with a plurality of pixels PL. In this embodiment, the pixels PL can be arranged in an array, which comprises at least one row or column. The second module 12 is disposed at one side of the first module 11, which is adjacent to the counter substrate 112 and away from the pixel substrate 111. The second module 12 comprises a plurality of micro-photoelectric units 121 and a protection layer 122. In this embodiment, the micro-photoelectric units 121 can be arranged in an array, which comprises at least one row or column. Each of the micro-photoelectric units 121 of the second module 12 unshields one or more of the pixels PL of the first module 11 in a stacking direction Ds of the first module 11 and the second module 12. In this embodiment, each of the micro-photoelectric units 121 of the second module 12 unshields none of the pixels PL of the first module 11 in a stacking direction Ds of the first module 11 and the second module 12. In the following, "unshields in a stacking direction Ds" means that two elements arranged in the stacking direction Ds are not aligned with each other. For example, the two elements arranged in the stacking direction Ds can be totally or partially misaligned with each other in spatial configuration, and one element is totally or partially unshielded by the other one. Each of the micro-photoelectric units 121 at least comprises a micro-photoelectric element, which can be a sensor element or a light-emitting element. In this embodiment, the micro-photoelectric elements of at least a part of the micro-photoelectric units 121 comprise a sensor element. In the following, the term of "at least comprise a micro-photoelectric element" comprises different numbers (e.g., one or more), different functions (e.g., sensor element or light-emitting element), different types of micro-photoelectric elements, such as CCD, CMOS image sensor (CIS), IR sensor, any combination of the above-mentioned elements, or any of other configurations within the scope of this disclosure. In the following, the term of "at least a part of the micro-photoelectric units" comprises one, some or all of the micro-photoelectric units. The configuration of the micro-photoelectric units 121 will be described in detail hereinafter. The protection layer 122 protects the micro-photoelectric units 121 and is disposed at one side of the second module 12 away from the first module 11. Since the fingerprint 21 comprises uneven textures (the friction ridges, which are raised portions of the epidermis on the digits), it can reflect, scatter, refract, or diffract the light from the external or internal light source, thereby generating the lights of different intensities. The generated lights of different intensities are detected by the sensor element(s) of at least a part of the micro-photoelectric units 121 so as to generate the corresponding sensing signals, and then the electronic device 1 can further perform the identification process based on the acquired sensing signal(s).

In the electronic device 1 as shown in FIG. 1A, in the stacking direction Ds, the first module 11 further comprises a display medium DM disposed between the pixel substrate 111 (the pixels PL) and the counter substrate 112, a common electrode layer 113 stacked on the display medium DM, a plurality of shielding units 114 and a plurality of filter units 115, which are disposed between the common electrode layer 113 and the counter substrate 112 and interlaced with each other, and a driving circuit 116 disposed on the pixel substrate 111. In this embodiment, the driving circuit 116 can be disposed on the pixel substrate 111, and the display medium DM and the common electrode layer 113 are stacked between the pixel substrate 111 and the counter substrate 112. The shielding units 114 and the filter units 115 can be disposed on the pixel substrate 111 or the counter substrate 112. In this embodiment, the shielding units 114 and the filter units 115 are disposed on the counter substrate 112 for example. In the first module 11, the shielding units 114 are disposed at one side of the counter substrate 112, which is away from the second module 12 and facing toward the pixel substrate 111. These shielding units 114 define a black matrix (BM) layer. Each shielding unit 114 is disposed around each pixel PL and located on a plane perpendicular to the stacking direction Ds, so that the light emitted from the pixel PL is not shielded by the shielding unit 114 and is thus defined by the shielding unit 114. The micro-photoelectric units 121 of the second module 12 are disposed corresponding to at least a part of the shielding units 114 of the first module 11, respectively, in the stacking direction Ds, and are aligned to the corresponding shielding units 114, respectively. In other words, in this embodiment, the micro-photoelectric units 121 of the second module 12 are aligned to the shielding units 114 of the first module 11, respectively, in the stacking direction Ds in a one-on-one manner. To be noted, not each of the shielding units 14 is configured with a corresponding micro-photoelectric unit 121, and the shielding unit 14 may be configured with one or more micro-photoelectric units 121. Accordingly, no matter how the micro-photoelectric units 121 and the shielding units 14 are arranged and aligned, each of the micro-photoelectric units 121 of the second module 12 is aligned to one of the shielding units 14 of the first module 11 in the stacking direction Ds. The filter units 115 are disposed at one side of the counter substrate 112, which is away from the second module 12 and facing toward the pixel substrate 111, and can be almost located on the same plane as the shielding units 114 or not. The filter units 15 define a color filter layer. The filter units 115 are aligned to the pixels PL, respectively, in the stacking direction Ds. In the following, the term "align in the stacking direction Ds" means that two elements are aligned with each other in the stacking direction Ds, and the center axles of two elements are aligned with each other, or the border of one element is covered by the border of the other element, or the borders of two elements are partially or totally aligned in spatial configuration. Under the above-mentioned conditions, such as the shielding units 114 are disposed around the pixels PL, respectively, and located on a plane perpendicular to the stacking direction Ds, the filter units 115 are aligned to the pixel PL, respectively, in the stacking direction Ds, and each micro-photoelectric unit 121 of the second module 12 is aligned to one of the shielding units 114 of the first module 11, each of the micro-photoelectric units 121 of the second module 12 unshields one or more of the pixels PL of the first module 11 in the stacking direction Ds. In this embodiment, the driving circuit 116 comprises a circuit layer including a plurality of driving units 116D, which are disposed corresponding to the pixels PL, respectively. The driving circuit 116 (the driving units 116D) and the pixels PL can be disposed on the same plane or not. Each driving unit 116D at least comprises a thin-film transistor (TFT) for driving the corresponding micro-photoelectric unit 121. In one aspect of this disclosure, each shielding unit 114 is located on the plane perpendicular to the stacking direction Ds, disposed around the corresponding pixel PL, and further extending to the corresponding driving unit 116D, so that each shielding unit 114 can further shields the corresponding driving unit 116D. In addition, the protection layer 122 can be a rigid substrate, a flexible substrate, or a protection film for covering the micro-photoelectric units 121.

In this disclosure, the display medium DM can be optionally selected based on the display type of the first module 11, such as the liquid crystal module or the OLED module. For example, the display medium DM can be optionally a liquid crystal material or an organic self-luminous material when the first module 11 is a liquid crystal module or an OLED module. In the electronic device of FIG. 1A, the display medium DM is a liquid crystal material.

In this embodiment, the second module 12 further comprises a matrix circuit 123 and a filling layer 124 disposed in the stacking direction Ds. The matrix circuit 123 is connected to the first module 11 and located between the micro-photoelectric units 121 and the first module 11, and the filling layer 124 is filled in the space between the micro-photoelectric units 121. The matrix circuit 123 comprises at least one circuit unit corresponding to each micro-photoelectric unit 121. The matrix circuit 123 is disposed on the counter substrate 112 of the first module 11 and electrically connected to the electrodes of the micro-photoelectric units 121. The above-mentioned circuit unit can be simply formed by traces or comprise traces and driving elements. The filling layer 124 can be made of an adhesive material or a non-adhesive material. In addition, the filling layer 124 can be made of a transparent material. The refractive index of the filling layer 124 may be equal to the refractive index of the protection layer or between the refractive indexes of the protection layer and the micro-photoelectric element. In this embodiment, the matrix circuit 123 and the filling layer 124 are disposed between the protection layer 122 of the second module 12 and the counter substrate 112 of the first module 11.

In this embodiment, if the display medium DM of the electronic device 1 is a liquid crystal material, as shown in FIG. 1A, the electronic device 1 further comprises a polarizer unit 13 and a backlight module 14. The polarizer unit 13 comprises a first polarizer 131 disposed in the first module 11 and a second polarizer 132 disposed in the second module 12. The backlight module is disposed at one side of the first module 11 away from the second module 12. Similar to the backlight module 14, the first polarizer 131 is disposed at one side of the first module 11 away from the second module 12. Furthermore, the first polarizer 131 is also disposed between the backlight module 14 and the pixel substrate 111 of the first module 11. The second polarizer 132 is disposed between the micro-photoelectric units 121 and the protection layer 122 of the second module. In this embodiment, the first polarizer 131 and the second polarizer 132 can be connected to the corresponding elements by the same or different adhesive materials. The second polarizer 132 can be connected to the micro-photoelectric element(s) of the micro-photoelectric units 121 by adhesive material, which can be optionally the same material as the filling layer 124.

In another embodiment of the electronic device 1, in which the display medium DM is a liquid crystal material, the common electrode layer 113 on the display medium DM can be removed.

Figure 1B:
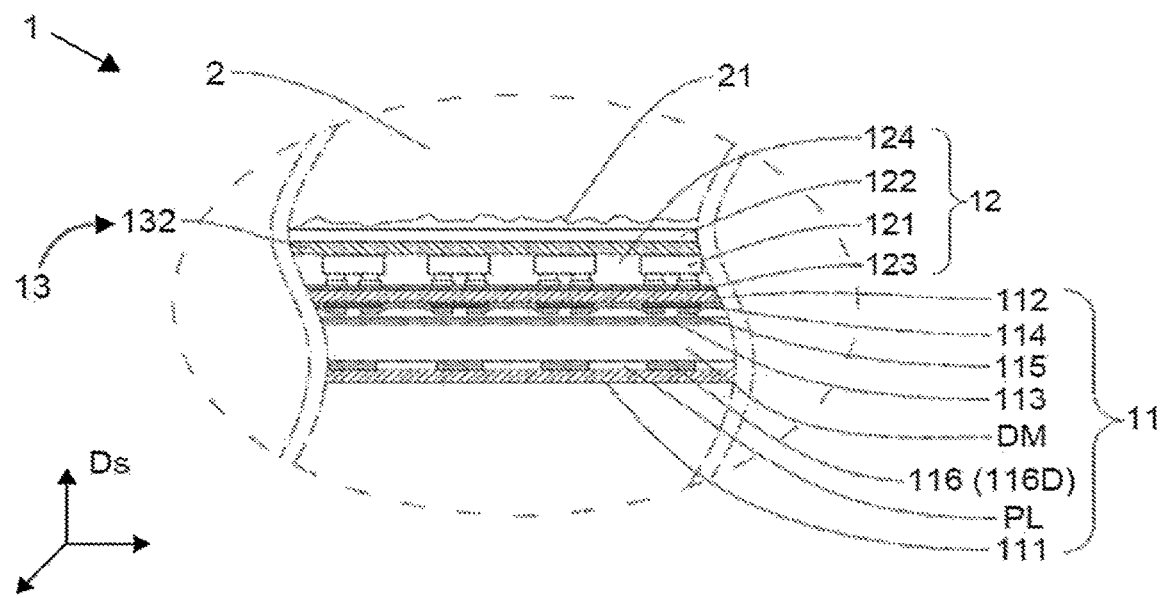
FIG. 1B is a partial enlarged view of another structure of the electronic device of FIG. 1.

In one embodiment of this disclosure, if the display medium DM of the electronic device 1 is an organic light-emitting material, as shown in FIG. 1B, the polarizer unit 13 comprises merely a second polarizer 132, and the backlight module 14 is not configured in the electronic device 1.

In another embodiment of the electronic device 1, in which the display medium DM is an organic light-emitting material, the electronic device 1 may not comprise the second polarizer 132.

In another embodiment of the electronic device 1, in which the display medium DM is an organic light-emitting material, the electronic device 1 may not comprise the color filter layer, which is composed of the filter units 115. In this case, the shielding units 114 can be optionally disposed on the pixel substrate 111.

In this disclosure, at least one micro-photoelectric unit 121 is disposed on the BM region, which does not shield the pixels PL, and no matter how many micro-photoelectric units 121 are configured, at least one micro-photoelectric element of one of the micro-photoelectric units 121 is a sensor element for providing the detecting (sensing) function. Herein, one kind of the micro-photoelectric element has the characteristics of switching function between a sensor element and a light-emitting element by applying different voltages. This disclosure comprises different light source modes, which includes the internal light source mode, the external light source mode, and the partial external and partial internal light source mode, and the amount, functions and types of the micro-photoelectric elements in the micro-photoelectric units 121 can have different configurations based on the selected light source mode. For example, when selecting the external light source mode, all of the micro-photoelectric units 121 are configured with only the sensor elements, which can be one or more and the same or different types of sensor elements. When selecting the internal light source mode or the partial internal light source mode, one of, at least a part of, or all of the micro-photoelectric units 121 can be configured with the light-emitting elements, which can be one or more and the same or different types of light-emitting elements (e.g. IR, UV, or visible light light-emitting elements). The above-mentioned light-emitting elements are not limited to be configured in the same micro-photoelectric unit 121 as the sensor element. In addition, the light-emitting element can be further rearranged in the arrangement of the sensor element. Besides, since the micro-photoelectric element can switch between the sensing function and the light-emitting function by applying different voltages, to make this disclosure more comprehensive, the micro-photoelectric element to be functioned as a sensor element or a light-emitting element is determined at the moment after applying the proper voltage. For example, when applying a forward bias to the micro-photoelectric element, the micro-photoelectric element functions as a light-emitting element; otherwise, when applying a reverse bias to the micro-photoelectric element, the micro-photoelectric element functions as a sensor element. In other words, the sensor element and the light-emitting element of this disclosure can be, for example but not limited to, any of the following aspects.

In one embodiment of this disclosure, at least a part of the micro-photoelectric units 121 each comprise a micro-photoelectric element. The micro-photoelectric elements of the part of micro-photoelectric units 121 are all light-emitting elements or sensor elements with the same structure or in the same type. Optionally, the micro-photoelectric elements of the part of micro-photoelectric units 121 have the same structure or are in the same type, and each of the micro-photoelectric element functions as a light-emitting element or a sensor element based on the applied voltage (forward bias or reverse bias).

In one embodiment of this disclosure, each of the micro-photoelectric elements of at least a part of the micro-photoelectric units 121 can be a sensor element or can comprise a plurality of sensor elements.

In one embodiment of this disclosure, each of the micro-photoelectric elements of at least a part of the micro-photoelectric units 121 can be a sensor element or a light-emitting element, or can comprise a plurality of sensor elements or a plurality of light-emitting elements.

In one embodiment of this disclosure, the micro-photoelectric elements of a part of the micro-photoelectric units 121 can comprise one or more sensor elements, and the micro-photoelectric elements of another part of the micro-photoelectric units 121 can comprise one or more light-emitting elements. The two parts of the micro-photoelectric units 121 can be the same number or different numbers.

In one embodiment of this disclosure, the micro-photoelectric elements of a part of the micro-photoelectric units 121 can comprise sensor elements of one or more types, and the micro-photoelectric elements of another part of the micro-photoelectric units 121 can comprise one or more sensor elements of one or more types. The type(s) of the sensor elements of two parts can be the same or partially the same.

In one embodiment of this disclosure, the micro-photoelectric elements of a part of the micro-photoelectric units 121 can comprise light-emitting elements of one or more types, and the micro-photoelectric elements of another part of the micro-photoelectric units 121 can comprise one or more light-emitting elements of one or more types. The type(s) of the light-emitting elements of two parts can be the same or partially the same. To be noted, the elements disposed between the light-emitting elements, between the sensor elements, or between the light-emitting element and the sensor element can be different types of micro-photoelectric elements, or can have different functions by providing a forward or reverse bias to the corresponding micro-photoelectric element.

Each micro-photoelectric unit 121 comprises at least one micro-photoelectric element. In this embodiment, for example, each micro-photoelectric unit 121 comprises two micro-photoelectric elements. One of the micro-photoelectric element is a sensor element, and the other micro-photoelectric element is a light-emitting element. In this case, the sensor element is located at a position within a reflection range defined and covered by the lighting angle θ of the light-emitting element. In this aspect, a plurality of micro-photoelectric units 121 continuously disposed in a direction Dx, which is perpendicular to the stacking direction Ds, can form a micro-photoelectric unit group. After being reflected, the light emitted from the light-emitting element of one micro-photoelectric unit 121 in each micro-photoelectric unit group can define a sensing range. Accordingly, the emitted light can be sensed or detected simultaneously by the sensing elements within the sensing range, such as the sensing element of the same micro-photoelectric unit 121 and the sensing elements of other micro-photoelectric units 121 disposed around the light-emitting element. This configuration can achieve the lighting-sensing relationship within one unit group or the lighting-sensing relationship between multiple unit groups. To be noted, in addition to the lighting angle θ of the light-emitting element, there are some factors capable of affecting the sensing range, such as the distance between two adjacent micro-photoelectric elements (e.g. pixel pitches, or distanced by how many pixels), the surface roughness of the reflector (e.g. a finger or a flat reflector), or the likes. In addition, the lighting-sensing relationship between multiple unit groups can be applied to any of the micro-photoelectric unit groups, so that the selected sensor element can only sense the light from the light-emitting element located at one specific side of the sensor element (instead of sensing the lights from multiple light-emitting elements) by designing the amounts of the micro-photoelectric unit groups, the micro-photoelectric units, and the micro-photoelectric elements in each micro-photoelectric unit.

Similarly, when each micro-photoelectric unit 121 comprises one micro-photoelectric element, it is possible to apply a forward bias to the micro-photoelectric element to function as a light-emitting element, or to apply a reverse bias to the micro-photoelectric element to function as a sensor element, thereby achieving the lighting-sensing relationship within one unit group. In each micro-photoelectric unit group, the micro-photoelectric element of one micro-photoelectric unit 121 (function as a sensor element) can sense the light emitted from the micro-photoelectric element of another micro-photoelectric unit 121 (function as a light-emitting element).

In some embodiments, the light-emitting element emits light toward the stacking direction Ds, the light range of the light-emitting element comprises the region scanned by the lighting angle θ with the stacking direction Ds as the axis, and the range covered by the light reflected from the light range is defined as the sensing range. When the light-emitting element emits light toward a direction other than the stacking direction Ds, the above definition can also be applicable.

The above-mentioned micro-photoelectric units 121 and/or micro-photoelectric unit groups 12G can be defined with, for example but not limited to, a direction Dx, which is perpendicular to the stacking direction Ds, or a plane defined by a direction Dx and a direction Dy, which are perpendicular to the stacking direction Ds.

In the electronic device 1 of this disclosure, the sensor element is located within the sensing range covered by the lighting angle θ of the light-emitting element. Accordingly, the detection accuracy and detection efficiency can be improved by flexibly configuring the amounts of the light-emitting element(s) and sensor element(s) in each micro-photoelectric unit 121.

In the electronic device 1 of this disclosure, the sensor element is located within the sensing range covered by the lighting angle θ of the light-emitting element, thereby improving the electricity detection and detection efficiency of the light-emitting element(s) and the sensor element(s). For example, when any of the light-emitting elements and the sensor elements fails to achieve the desired function (e.g., fails to emit light or fails to sense), it can be easily found.

To be understood, in this embodiment, when the amount of the micro-photoelectric elements is greater than one and both of the light-emitting element and the sensor element exist, it can be carried out by applying the forward bias or reverse bias to the corresponding micro-photoelectric element.

In the electronic device 1 of this disclosure, the micro-photoelectric units 121 of the second module 12 unshields one or more of the pixels PL of the first module 11 in the stacking direction Ds. In other words, in the viewing direction from the finger 2 to the electronic device 1, each of the micro-photoelectric units 121 is distributed to align with the corresponding shielding unit 114, thereby filling the space between two adjacent pixels PL without interfering the display function of each pixel PL. In this embodiment, the sensor element of each micro-photoelectric unit 121 can generate different photoelectric currents (sensing signals) based on different detection results. Then, the sensing signals can be read by the matrix circuit 123 and then compared with the sensing signals stored in the electronic device 1 (e.g., the pre-stored fingerprints, which are established in advance). When the detected sensing signal is identical to the pre-stored signal, the electronic device 1 can perform the consequential operation such as unlocking or data accessing, thereby achieving the biometric identification application through the electronic device 1.

In this embodiment, when the electronic device 1 is applied to measure the parameters such as pulse or blood oxygen saturation, each micro-photoelectric unit 121 can comprise the light-emitting element or the sensor element. Herein, the light-emitting element emits light toward the skin (the finger 2 of FIG. 1 can be substituted by the skin of any of other portion of body), and then the photoelectric currents (sensing signals), which are generated from the light after being reflected, scattered, refracted, or diffracted by skin, can be received by the sensor element of each micro-photoelectric unit 121. The sensing signal received by the sensor element of each micro-photoelectric unit 121 is a photoplethysmography (PPG) signal, which is then read by the matrix circuit 123. When the pulse is generated, the blood flux in the blood vessels of the whole body will change, which means that the content of hemoglobin and deoxyhemoglobin in the blood vessels will also change. Herein, the hemoglobin and deoxyhemoglobin are very sensitive to light of specific wavelengths (e.g., red light and IR light). Therefore, if the light-emitting element of each micro-photoelectric unit 121 emits light (e.g., red light, IR light, or green light) to the tissues and blood vessels under the skin, and then the sensor element of each photoelectric unit 121 receives the light reflected or penetrating through the skin. Through the intensity of the received light, the blood flux changes in the blood vessels can be obtained, and this change is called the PPG signal. PPG is a physical quantity produced by the blood circulatory system. When the heart contracts and relaxes, the blood flux per unit area in the blood vessels will cause periodic changes. Since the change of the PPG signal is caused by the pulse, the energy intensity of the reflected, scattered, refracted, or diffracted light received by the sensor element of each micro-photoelectric unit 121 can correspond to the pulse. Accordingly, the sensor element of each micro-photoelectric unit 121 can be used to measure the changes of the pulse and blood oxygen concentration of the human body, as well as other related physiological information.

In this disclosure, since the sensor element is disposed closer to the finger (the object to be detected), the undesired interference can be prevented, thereby obtaining a more accurate detection rate or recognition rate. Herein, "the sensor element is disposed closer to the object to be detected" is relative to the configuration of disposing the sensor element on the first module 11 or at one side of the first module 11 away from the second module 12.

Figure 2:
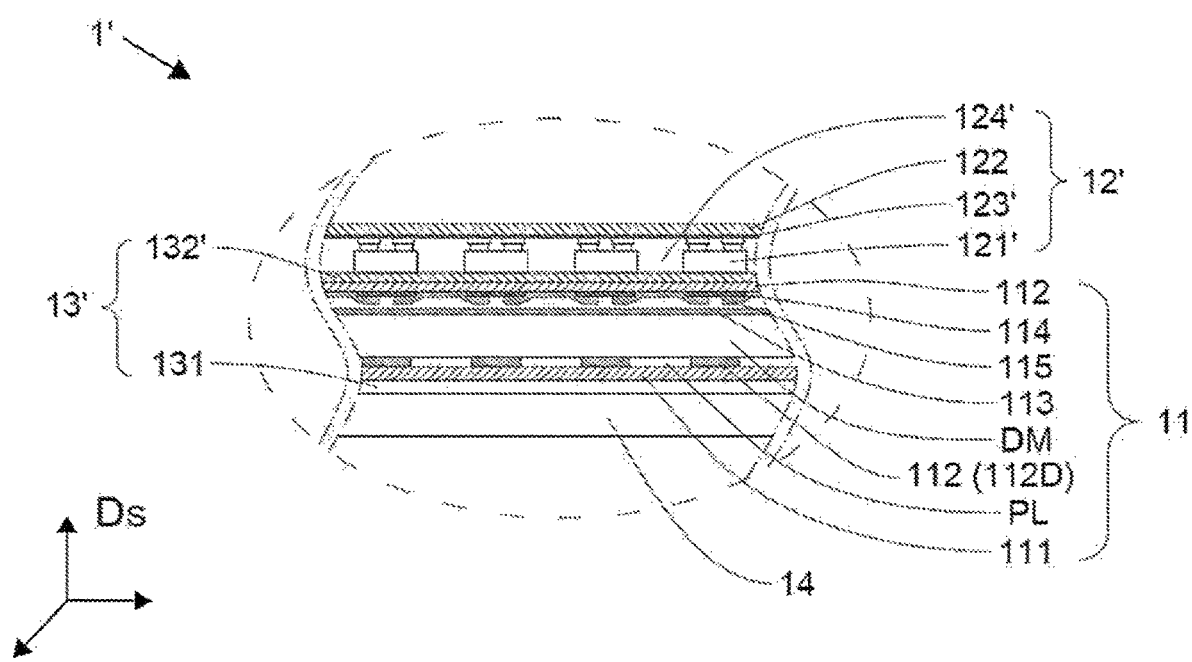
FIG. 2 is a partial enlarged view of a structure of an electronic device according to another embodiment of this disclosure.

FIG. 2 is a partial enlarged view of a structure of an electronic device 1 according to another embodiment of this disclosure.

In this embodiment, the driving circuit 116 is disposed on the pixel substrate 11, the shielding units 114 and the filter units 115 are disposed on the counter substrate 112, and the display medium DM and the common electrode layer 113 are disposed between the pixel substrate 111 and the counter substrate 112. The filling layer 124' is filled in the space between the micro-photoelectric elements 121'. The polarizer unit 13' comprises a first polarizer 131 disposed on the first module 11 and a second polarizer 132' disposed on the second module 12. The first polarizer 131 is located between the backlight module 14 and the pixel substrate 111 of the first module 11, and the second polarizer 132' is located on the counter substrate 112 of the first module 11. Different from the embodiment of FIG. 1A, in the embodiment of FIG. 2, the micro-photoelectric elements 121' are configured in a flip-chip manner, the matrix circuit 123' and the filling layer 124' of the second module are located between the protection layer 122 of the second module 12 and the counter substrate 112 of the first module 11, the matrix circuit 123' is disposed at one side of the protection layer 122 facing toward the first module 11 and located between the protection layer 122 and the micro-photoelectric elements 121', the matrix circuit 123' is electrically connected to the electrodes of the micro-photoelectric elements 121', and the filling layer 124' is disposed between the matrix circuit 123' located on the protection layer 112 and the second polarizer 132' located on the counter substrate 112 of the first module 11.

In one embodiment of this disclosure, as shown in FIG. 2, the micro-photoelectric elements 121' are disposed in a flip-chip manner, and this feature can be applied to any derived embodiments of this disclosure.

Figure 3B:
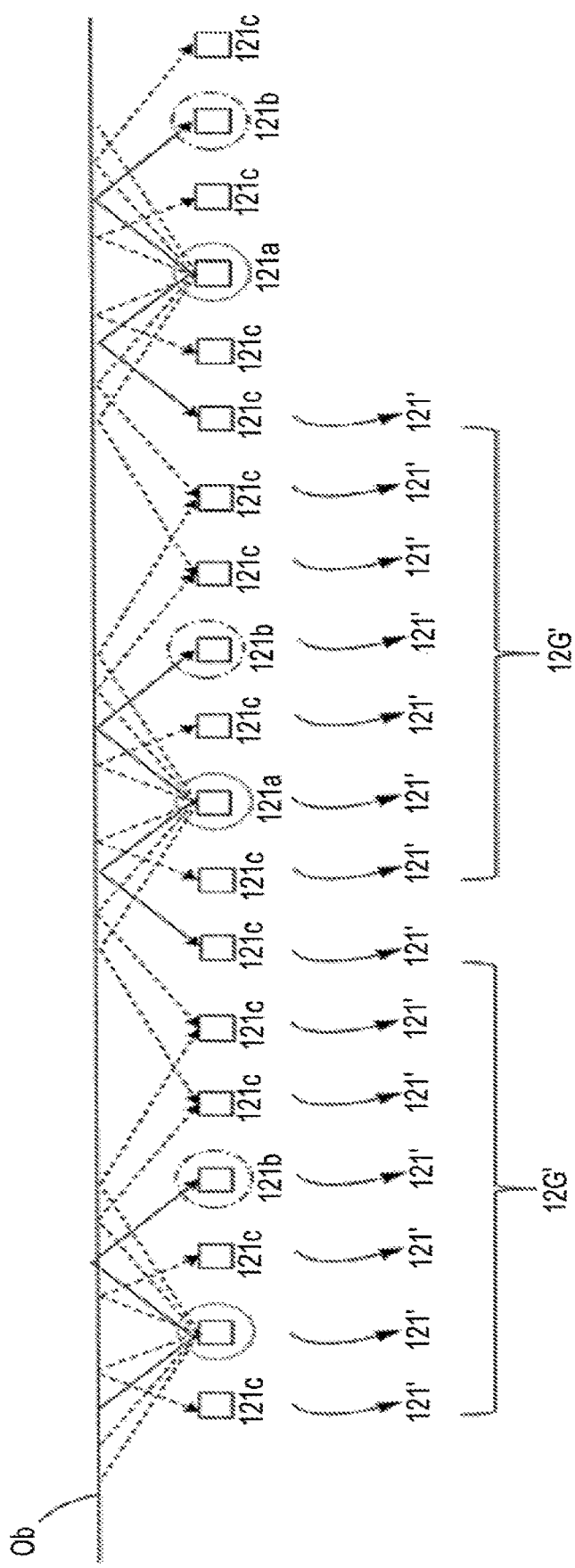

FIGS. 3A to 3G are schematic diagram showing different operation aspects of the electronic device according to another embodiment of this disclosure, and FIGS. 4A to 4G are waveform diagrams showing the operation waveforms (voltages) corresponding to the aspects of FIGS. 3A to 3G, respectively. In these aspects, a corresponding forward bias or reverse bias is applied to one of the micro-photoelectric element for causing the sensing function or the light-emitting function. Referring to FIG. 3A, each micro-photoelectric unit 121 comprises one micro-photoelectric element, and a micro-photoelectric unit group 12G' comprises a plurality adjacent micro-photoelectric units 121'. The distance between adjacent two micro-photoelectric units 121' is one unit, which is defined as at least one positive integer times of the width of the pixel. When the micro-photoelectric element is a light-emitting element 121a, the sensible range of the light emitted from the micro-photoelectric element 121a is M units. In the same micro-photoelectric unit group, when the micro-photoelectric element 121a of one of the micro-photoelectric units 121' emits light, the micro-photoelectric element of another micro-photoelectric unit 121' in the same micro-photoelectric unit group 12G' or another micro-photoelectric unit group 12G' is selected as a sensor element 121b, wherein the micro-photoelectric element 121a and the micro-photoelectric element 121b are distanced by N units. Herein, each of M and N is a positive integer or zero, and M is greater than N.

In this embodiment, one micro-photoelectric element of one of the micro-photoelectric units 121' in one micro-photoelectric unit group 12G functions to emit light, and one micro-photoelectric element of another micro-photoelectric unit 121' in the same micro-photoelectric unit group 12G' is selected to sense the light, wherein the two micro-photoelectric elements are distanced by N units. In some embodiments, adjacent two of the micro-photoelectric unit groups 12G' are distanced by (M+N+1) units, wherein (M+N+1) is calculated by (2M)−(M−N)+1. In this embodiment, the adjacent two micro-photoelectric unit groups 12G' are kept in the distance of (M+N+1) units within per timeframe (e.g., per mini second), but this disclosure is not limited thereto.

In this embodiment, the distance between adjacent two micro-photoelectric units 121 is defined as the width of one pixel (one unit), so that the adjacent two micro-photoelectric unit groups 12G' are distanced by (M+N+1) pixels. To be noted, when the sensible range of the light emitted by the light-emitting element 121a is very wide or the width of the pixel is very small, one unit defined between adjacent two micro-photoelectric units 121' can be equal to the total width of multiple pixels.

Figure 4B:
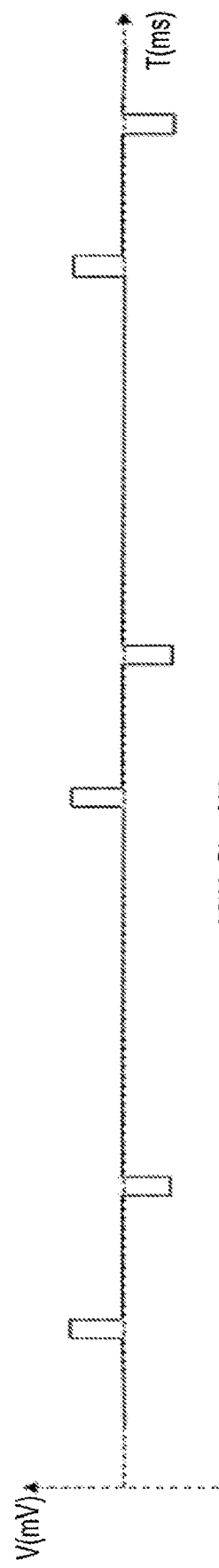
Figure 3C:
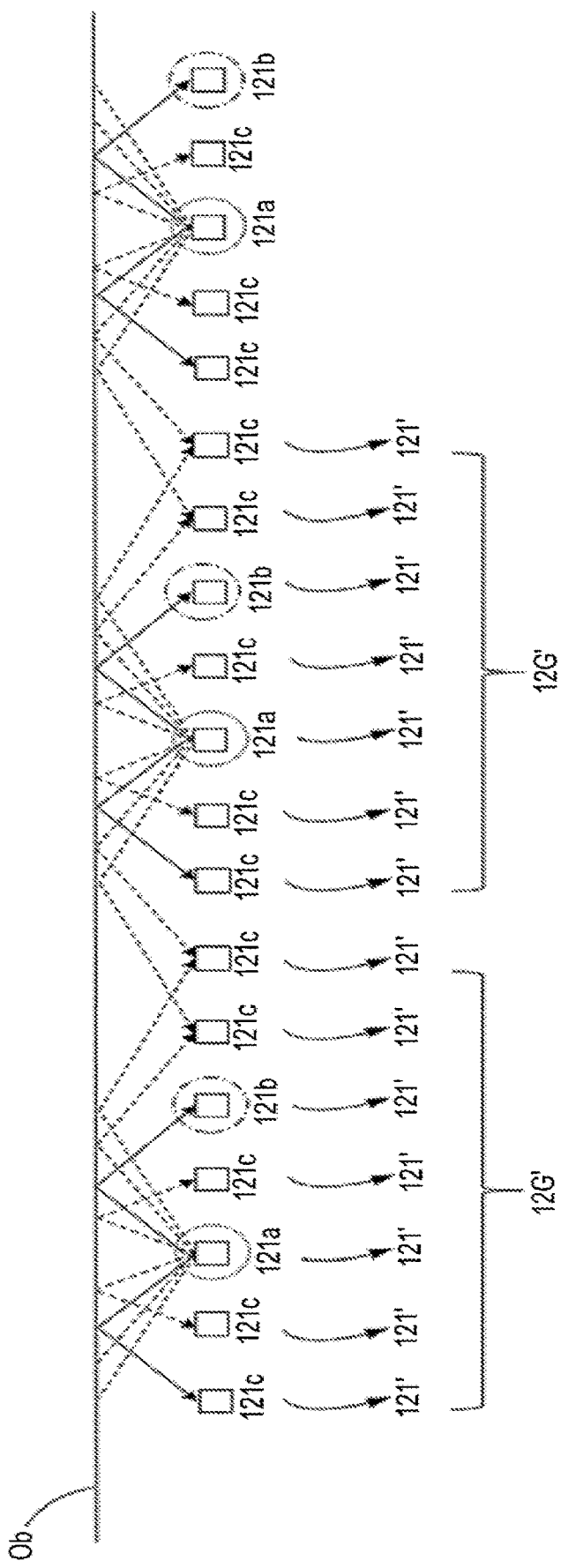
Figure 4C:
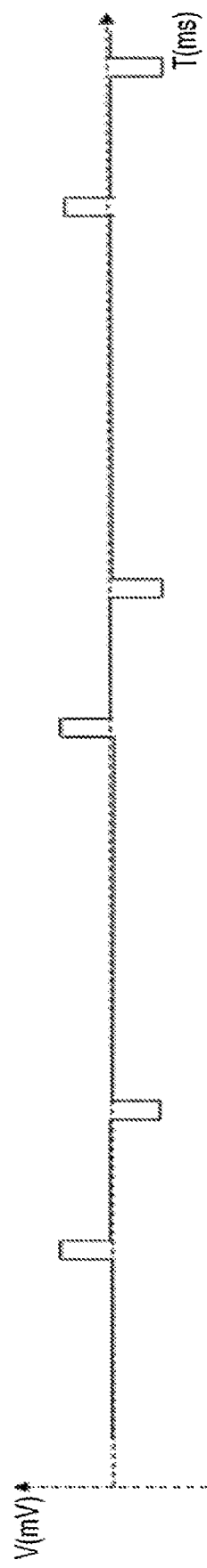
Figure 3D:
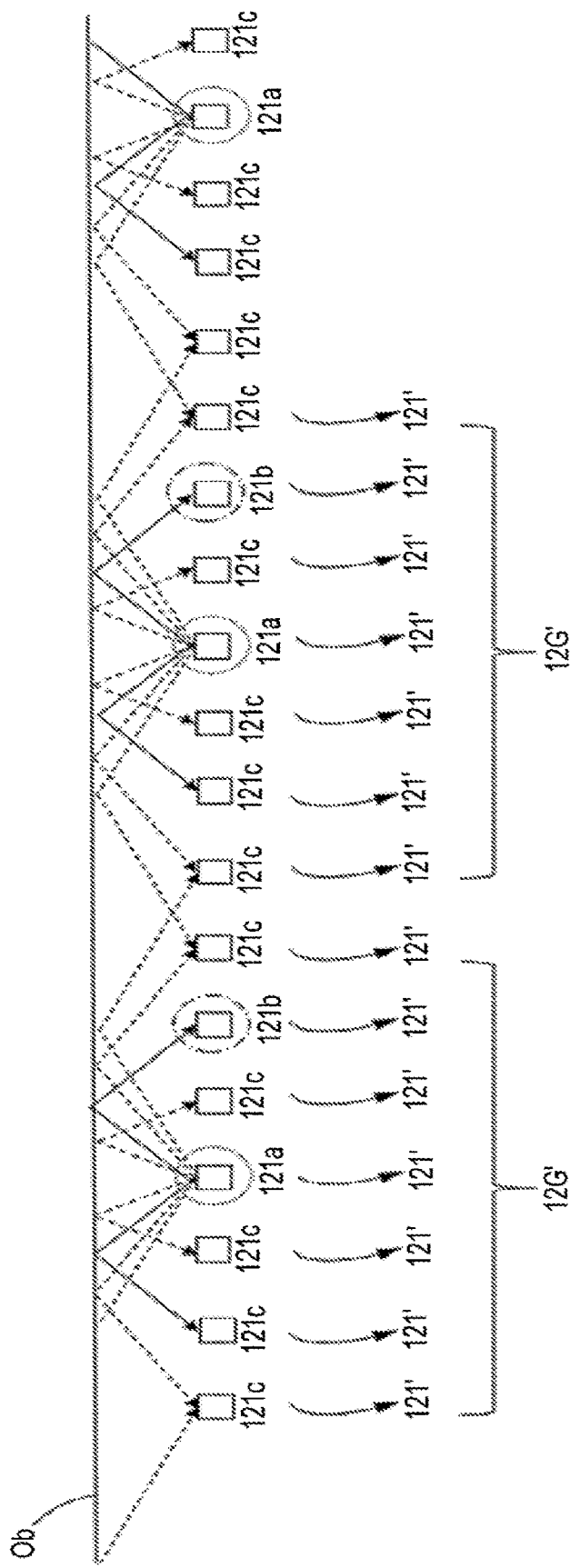
Figure 4D:
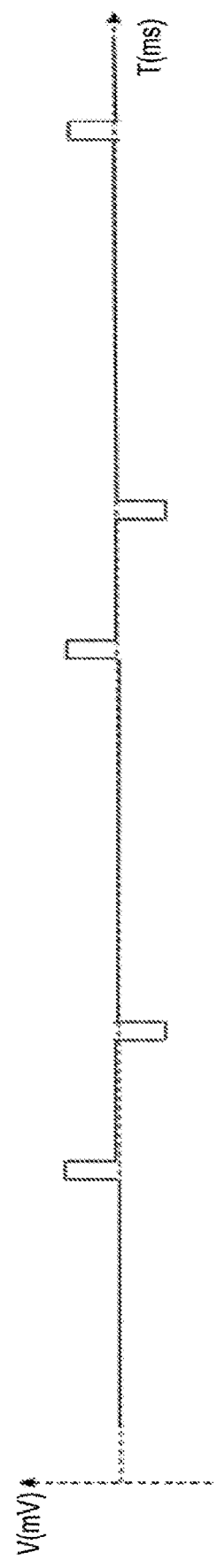
Figure 3E:
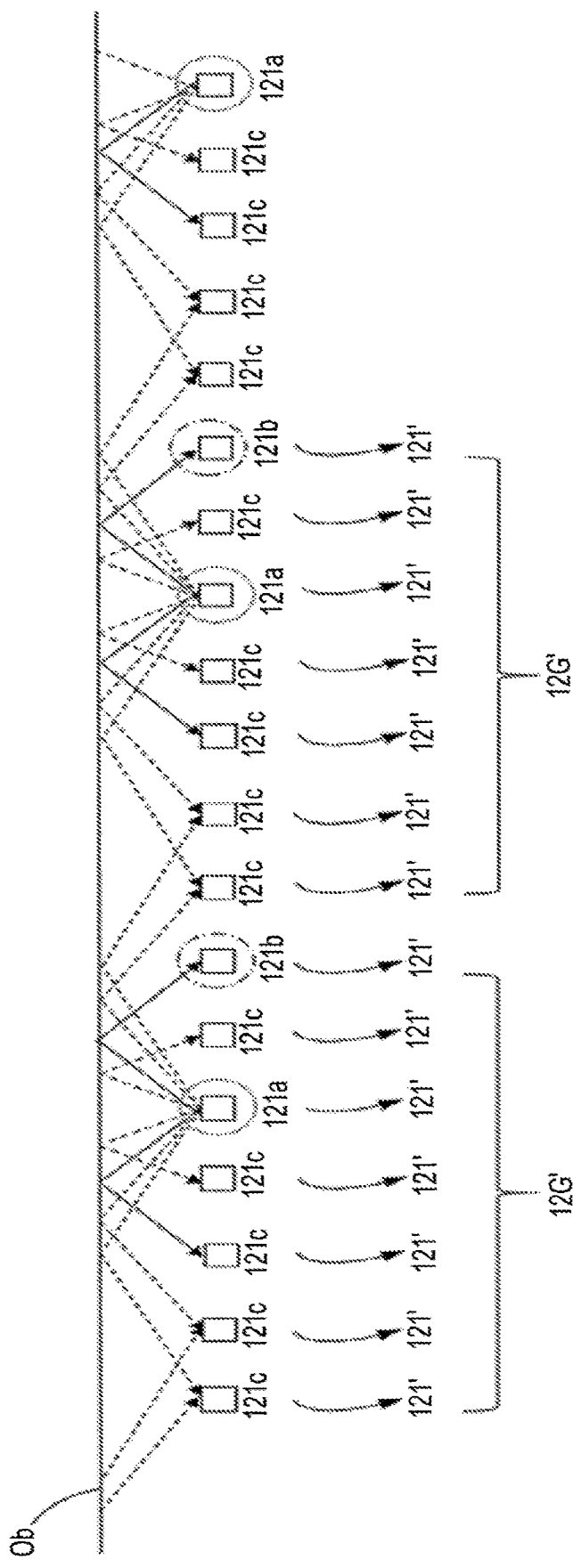
Figure 4E:
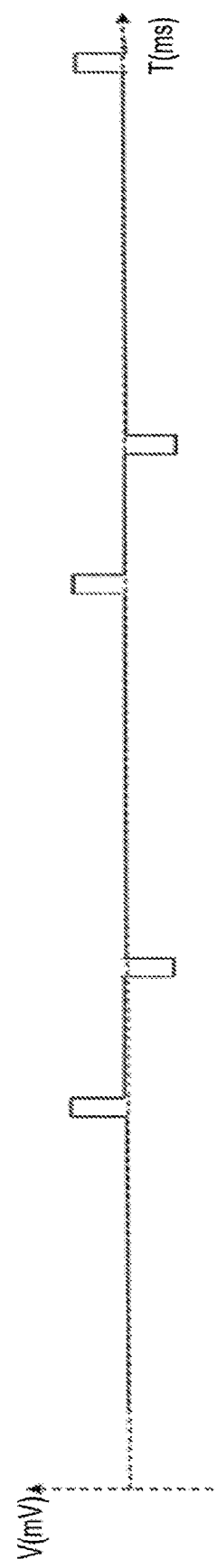
Figure 3F:
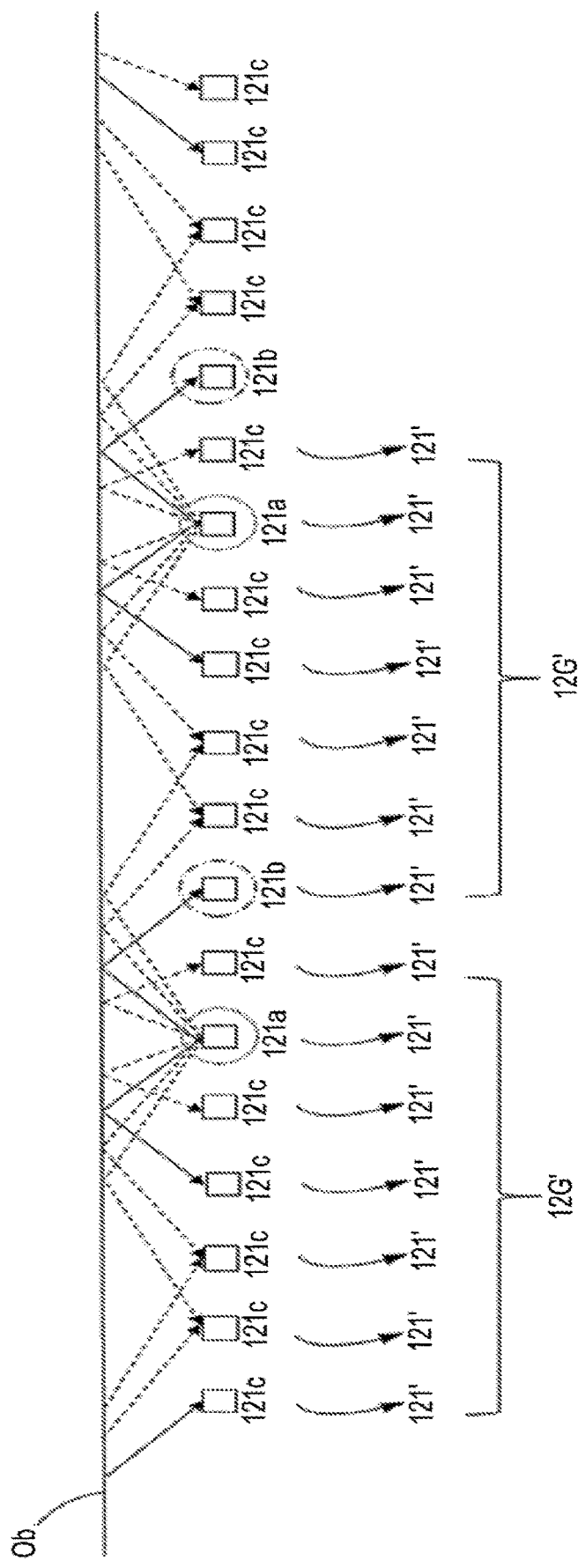
Figure 4F:
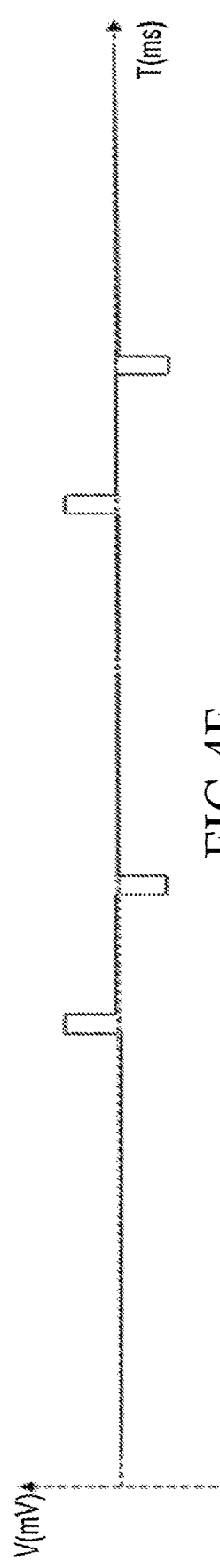
Figure 3G:
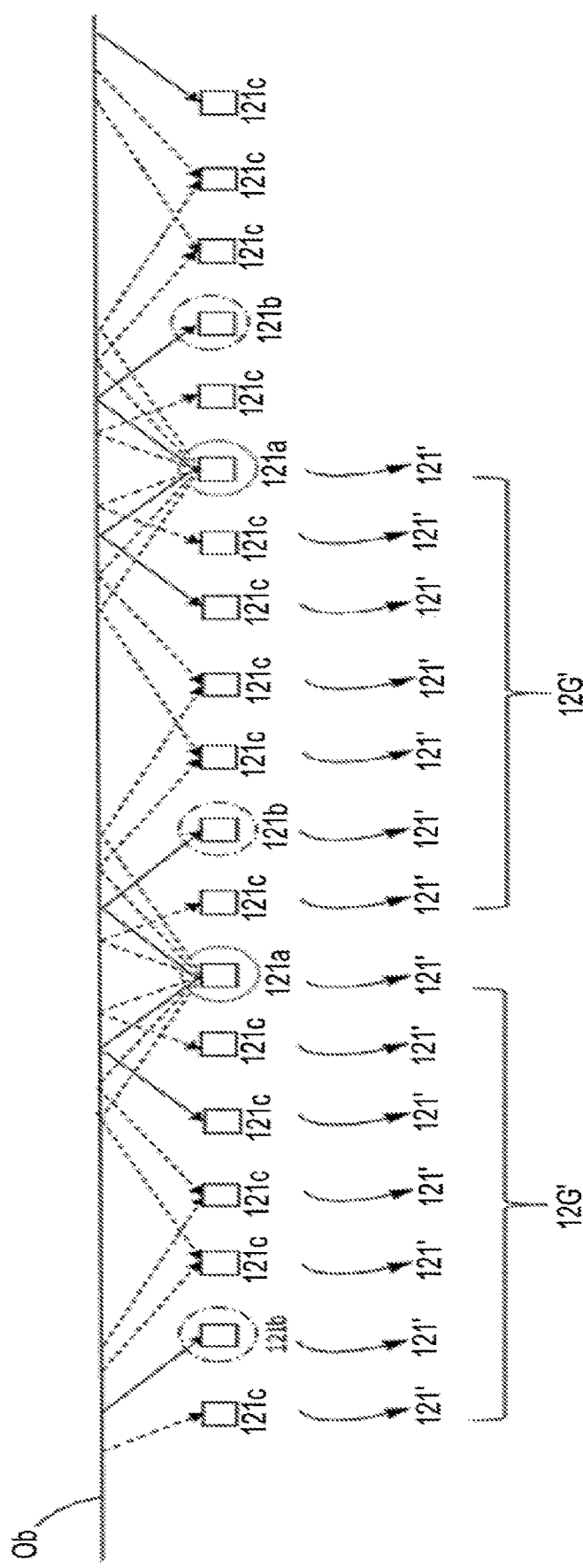
Figure 4G:
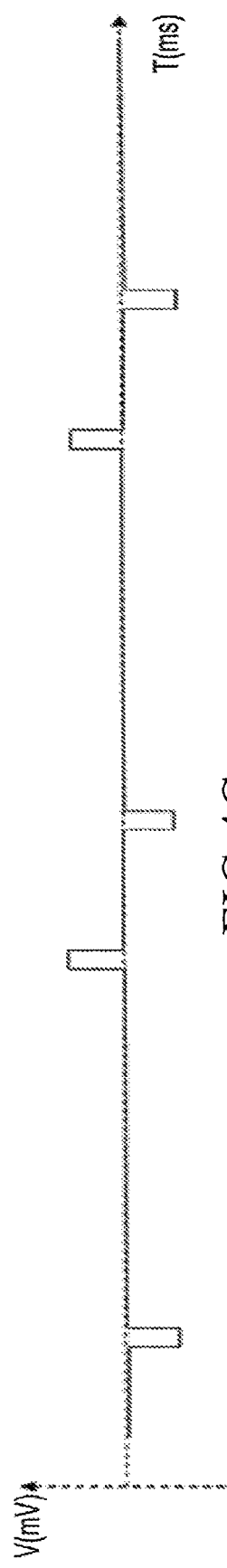

In the following example, M is 4, N is 2, and each micro-photoelectric unit group 12G' comprises 7 pixels (M+N+1=7). A forward bias is applied to the micro-photoelectric units 121' sequentially (e.g., start from the left side of the micro-photoelectric units 121'), so that the micro-photoelectric unit of each micro-photoelectric unit 121' can be sequentially enabled to function as a light-emitting element 121a. The sensible range of the light-emitting element 121a is defined as a circle, wherein the light-emitting element 121a is the center of the circle, and the radius of the circle is equal to the width of four pixels. In addition, a reverse bias is applied to another micro-photoelectric element, which is selected from four pixels at one side of the light-emitting element 121a. Herein, the reverse bias is applied to another micro-photoelectric element, which is two pixels away from the light-emitting element 121a, so as to function as a sensor element 121b. The residual micro-photoelectric elements (121c) are not applied with any of the forward and reverse bias. Accordingly, the lighting-sensing sequence can be indicated by FIGS. 3A to 3G. Referring to FIG. 3A, the forward-reverse bias relationship is to apply a forward bias, zero, a reverse bias, zero, zero, zero, and zero in sequence (as shown in FIG. 4A), then to apply zero, a forward bias, zero, a reverse bias, zero, zero, and zero in sequence (as shown in FIG. 4B), and so on (until the waveform as shown in FIG. 4G). To be noted, FIGS. 3A to 3E and FIGS. 4A to 4E are the lighting-sensing relationship within a single unit group, and FIGS. 3F to 3G and FIGS. 4F to 4G are the lighting-sensing relationship between multiple unit groups.

To be noted, in this embodiment, when a selected reflective object Ob has a uniform surface roughness, the operation process as shown in FIGS. 3A to 3G and FIGS. 4A to 4G can be used to test whether the functions of the micro-photoelectric elements are normal, or whether the functions thereof match the requirement.

To be noted, the micro-photoelectric elements are applied with a forward bias sequentially (and/or one-on-one) so as to function as a light-emitting element. In addition, another one of the micro-photoelectric elements, which is disposed aside the light-emitting element (e.g. at one side or two sides of the light-emitting element), is applied with a reverse bias so as to function as a sensor element. The amount of the sensor elements can be one or more. In this embodiment, each of M and N is a positive integer, which is greater than zero. Moreover, when each micro-photoelectric unit 121' comprises multiple micro-photoelectric elements, each of M and N can be zero.

To be noted, in this embodiment, the specific voltages can be applied to the micro-photoelectric elements in sequence or not in sequence.

In this embodiment, the amount of the light-emitting elements 121a and the amount of the sensing unit 121b of each micro-photoelectric unit 121' can be flexibly arranged, which is benefit to improve the accuracy of detection rate and the detection efficiency. In addition, the sensor element 121b is located within the sensible range of the light-emitting element 121a, which is benefit to the electricity detection and the detection efficiency of the light-emitting element 121a and the sensor element 121b.

In the above-mentioned embodiments, the matrix circuit 123 (123') can be electrically connected to the micro-photoelectric units 121 (121'). The electronic device 1 (1') can further comprise a control element, which is directly or indirectly electrically connected to a control element (not shown) of the matrix circuit 123 (123'). The control element can be, for example, an IC element for controlling the micro-photoelectric units 121 (121') and/or the driving circuit 116 (as well as the driving unit 116D thereof). The aspects of the electrical connection between the control element and the matrix circuit 123 (123') are not limited. For example, the control element can be directly disposed on the pixel substrate 111 of the first module 11, and then electrically connected to the matrix circuit 123 (123') via the circuit layout on the pixel substrate 111. Optionally, the control element can be disposed on a driving circuit board, which can be stacked on and disposed parallel to the pixel substrate 111, and then electrically connected to the pixel substrate 111 via a flexible substrate. In an additional aspect, the control element can be disposed on the above-mentioned flexible substrate.

As mentioned above, the electronic device of this disclosure mainly comprising micro-photoelectric elements can be widely used in various electronic devices, and can provide a high accuracy detection rate. The advantage of the electronic device of this disclosure is that: each micro-photoelectric unit of the second module is misaligned with the corresponding pixel of the first module in the stacking direction so as to unshield one or more of the pixels, so that each micro-photoelectric unit can fill the gap between two adjacent pixels, thereby not interfering the display function of each pixel, and not interfering the lighting function or the detecting/recognizing function of each micro-photoelectric unit. In addition, the amounts of the micro-photoelectric unit groups, the micro-photoelectric units, and the micro-photoelectric elements can be flexibly arranged, which is benefit to improve the accuracy of detection rate and the detection efficiency. In addition, the sensor element is located within the sensible range of the light-emitting element, which is benefit to the electricity detection and the detection efficiency of the micro-photoelectric elements.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
a display panel comprising a pixel flexible substrate, a driving circuit, a display medium formed from an organic light-emitting material, and a plurality of shielding units; and
a plurality of micro photoelectric units adjacent to a protection layer and away from the display panel,
wherein the plurality of micro-photoelectric units comprise respective micro-photoelectric elements, and at least one of the micro-photoelectric element is, or includes, a sensor element,
wherein the protection layer serves to protect the plurality of micro-photoelectric units while being located at one side of the plurality of micro-photoelectric units, and
wherein each of the plurality of micro photoelectric units is configured to:
emit light toward an object, and
receive the light reflected, scattered, refracted, or diffracted by, or penetrating through, the object, or receive a signal generated from the light after being reflected, scattered, refracted, or diffracted by, or penetrating through, the object.

2. The electronic device of claim 1, wherein the light emitted from the plurality of micro photoelectric units comprises at least one of red light, infrared (IR) light, and green light.

3. The electronic device of claim 1, wherein each of the plurality of micro photoelectric units comprises at least one micro-photoelectric element emitting infrared (IR) light, ultraviolet (UV) light, or visible light.

4. The electronic device of claim 1, further comprising:
a plurality of pixels connected to the driving circuit,
wherein at least one of the plurality of micro photoelectric units unshields one or more of the plurality of pixels.

5. The electronic device of claim 1, wherein the protection layer is a rigid substrate, a flexible substrate, or a protection film for covering the plurality of micro-photoelectric units.

6. The electronic device of claim 1, further comprising:
a plurality of shielding units disposed over the pixel substrate.

7. The electronic device of claim 6, further comprising:
a plurality of pixels connected to the driving circuit,
wherein each of the plurality of shielding units surrounds a corresponding one of the plurality of pixels.

8. The electronic device of claim 1, wherein the signal received by each of the plurality of micro photoelectric units is a photoplethysmography (PPG) signal.

9. The electronic device of claim 8, wherein the photoplethysmography (PPG) signal is indicative of a physical quantity produced by blood circulatory system.

10. The electronic device of claim 1, wherein the signal received by each of the plurality of micro photoelectric units is a photoelectric current.

11. The electronic device of claim 1, wherein the electronic device is a virtual reality (VR) head-mounted display or an augmented reality (AR) head-mounted display.

12. The electronic device of claim 1, wherein each of the plurality of micro photoelectric units comprises a light-emitting element and the sensor element.

13. The electronic device of claim 12, wherein:
the light-emitting element is configured to emit the light; and
the sensor element is configured to sense the light reflected, scattered, refracted, or diffracted by, or penetrating through, the object, and to generate the signal.

14. The electronic device of claim 13, wherein:
the light-emitting element emits the light toward a skin of the object; and
the sensor element measures one or more changes of pulse and blood oxygen concentration of a body of the object.

15. The electronic device of claim 1, wherein:
micro-photoelectric elements of a part of the plurality of micro photoelectric units comprise light-emitting elements of one or more types; and
micro-photoelectric elements of another part of the micro-photoelectric units comprise one or more light-emitting elements of one or more types.

16. The electronic device of claim 1, wherein each of micro-photoelectric elements of at least a part of the plurality of micro-photoelectric units is a sensor element or a light-emitting element, or comprises a plurality of sensor elements or a plurality of light-emitting elements.

17. The electronic device of claim 1, wherein a micro-photoelectric element of one micro-photoelectric unit among the plurality of micro-photoelectric units, which functions as a sensor element, senses the light emitted from a micro-photoelectric element of another micro-photoelectric unit among the plurality of micro-photoelectric units, which functions as a light-emitting element.

18. The electronic device of claim 1, further comprising:
a driving circuit board stacked on and disposed parallel to the pixel substrate; and
a control element disposed on the driving circuit board and electrically connected to the pixel substrate via a flexible substrate.

19. The electronic device of claim 1, further comprising:
a plurality of pixels connected to the driving circuit,
wherein the driving circuit comprises a plurality of driving units, and the plurality of driving units and the plurality of pixels are disposed in a same layer.

20. The electronic device of claim 1, further comprising:
a plurality of pixels connected to the driving circuit; and
a plurality of filter units disposed over the pixel substrate,
wherein each of the plurality of filter units comprises at least one protrusion facing the plurality of pixels.

* * * * *